US010516258B2

(12) United States Patent
Ebrahimi Afrouzi et al.

(10) Patent No.: US 10,516,258 B2
(45) Date of Patent: Dec. 24, 2019

(54) RETRACTABLE CABLE ASSEMBLY IN USE WITH ELECTRICAL DEVICES

(71) Applicants: Ali Ebrahimi Afrouzi, San Jose, CA (US); Michael Patrick Phillips, San Francisco, CA (US)

(72) Inventors: Ali Ebrahimi Afrouzi, San Jose, CA (US); Michael Patrick Phillips, San Francisco, CA (US)

(73) Assignee: AI Incorporated, Toronto (CA)

( * ) Notice: Subject to any disclaimer, the term of this patent is extended or adjusted under 35 U.S.C. 154(b) by 0 days.

(21) Appl. No.: 15/919,031

(22) Filed: Mar. 12, 2018

(65) Prior Publication Data
US 2018/0269672 A1   Sep. 20, 2018

Related U.S. Application Data

(60) Provisional application No. 62/473,024, filed on Mar. 17, 2017.

(51) Int. Cl.
| | |
|---|---|
| *H02G 11/02* | (2006.01) |
| *H02J 7/00* | (2006.01) |
| *H05K 5/02* | (2006.01) |
| *B65H 75/30* | (2006.01) |
| *H05K 5/00* | (2006.01) |
| *B65H 75/44* | (2006.01) |

(52) U.S. Cl.
CPC .......... *H02G 11/02* (2013.01); *B65H 75/30* (2013.01); *B65H 75/4428* (2013.01); *B65H 75/4471* (2013.01); *H02J 7/0042* (2013.01); *H05K 5/0004* (2013.01); *H05K 5/0217* (2013.01); *B65H 2701/34* (2013.01)

(58) Field of Classification Search
CPC ................ H02G 11/02; H01R 13/72
USPC ........................... 439/501; 381/370
See application file for complete search history.

(56) References Cited

U.S. PATENT DOCUMENTS

| | | | | | |
|---|---|---|---|---|---|
| 2,364,188 | A | * | 12/1944 | Bryce | G03B 27/46 355/42 |
| 3,056,863 | A | * | 10/1962 | Johnson | H01R 13/72 191/12.4 |
| 3,248,069 | A | * | 4/1966 | Nichols | B60R 22/405 242/379 |

(Continued)

*Primary Examiner* — Tulsidas C Patel
*Assistant Examiner* — Peter G Leigh (57) ABSTRACT

A retractable cable assembly in use with an electrical charger, power adapter, or other power supply. A cable wound on a spool within the cable assembly housing may be extracted by manually pulling on the cable or pressing of a release switch until the desired length of the cord is drawn. As the cord is drawn a torsional spring rotatably coupled to the spool and located within the core of the spool is compressed. An engaged pawl-ratchet mechanism is used to keep the spool, torsional spring and cord in place during and after extraction of the cord until which time retraction of the cord is desired. Rotation or twisting of the housing lid or of the main housing of the retractable cable assembly housing disengages the pawl-ratchet mechanism, thereby freeing the spool and torsional spring. The compressed torsional spring within the core of the spool rotates immediately as it decompresses causing the coupled spool to rotate and retract the cable, thereby winding it back around the spool within the housing.

20 Claims, 5 Drawing Sheets

(56) References Cited

U.S. PATENT DOCUMENTS

| | | | |
|---|---|---|---|
| 3,657,491 A * | 4/1972 | Ryder | B65H 75/4434 191/12.2 R |
| 3,705,962 A | 12/1972 | Banister | |
| 4,384,688 A * | 5/1983 | Smith | B65H 75/4434 191/12.2 R |
| 4,713,497 A * | 12/1987 | Smith | H02G 11/02 191/12.2 R |
| 4,842,108 A | 6/1989 | Anderson et al. | |
| 5,236,371 A * | 8/1993 | Matthis | H02G 11/02 439/501 |
| 5,422,957 A * | 6/1995 | Cummins | B65H 75/4431 381/384 |
| 5,701,981 A | 12/1997 | Marshall et al. | |
| 6,059,081 A | 5/2000 | Patterson et al. | |
| 6,082,656 A | 7/2000 | Thornton | |
| 6,230,860 B1 | 5/2001 | Wu | |
| 6,264,016 B1 | 7/2001 | Bales | |
| 6,325,665 B1 * | 12/2001 | Chung | H01R 13/72 439/501 |
| 6,371,398 B1 * | 4/2002 | Liao | B65H 75/4434 191/12.4 |
| 6,540,168 B1 | 4/2003 | Archer et al. | |
| 6,575,781 B2 * | 6/2003 | Wen-Hsuan | H01R 13/72 191/12.4 |
| 6,578,683 B1 | 6/2003 | Burke et al. | |
| 6,616,080 B1 * | 9/2003 | Edwards | A45C 7/0045 191/12.2 R |
| 6,623,294 B2 * | 9/2003 | Tse | H01R 13/72 439/174 |
| 6,658,130 B2 * | 12/2003 | Huang | H04R 1/1033 379/430 |
| 6,803,525 B1 | 10/2004 | Liao | |
| 6,808,138 B2 * | 10/2004 | Liao | B65H 75/4423 242/378.1 |
| 6,942,079 B2 * | 9/2005 | Chang | H02G 11/02 191/12.4 |
| 7,017,846 B2 | 3/2006 | Tsoi et al. | |
| 7,364,109 B2 | 4/2008 | Kuo | |
| 7,419,038 B2 * | 9/2008 | Caamano | B65H 75/40 191/12.2 R |
| 7,562,752 B2 * | 7/2009 | Lee | H02G 11/02 191/12.2 R |
| 7,604,194 B2 * | 10/2009 | Chang | B65H 75/28 242/378.1 |
| 7,896,281 B2 * | 3/2011 | Bleshoy | A01K 27/004 119/796 |
| 8,136,751 B2 * | 3/2012 | Chen | B65H 75/4434 242/378.1 |
| 8,191,815 B2 * | 6/2012 | Huang | B65H 75/48 242/379 |
| 8,774,443 B1 * | 7/2014 | Anderson | B65H 75/4431 242/378.4 |
| 9,038,795 B2 | 5/2015 | Ichikawa | |
| 9,272,876 B2 | 3/2016 | Draganovic et al. | |
| 9,392,349 B2 | 7/2016 | Merenda | |
| 2002/0040945 A1 * | 4/2002 | Stepancich | B65H 75/4431 242/378.1 |
| 2004/0032741 A1 * | 2/2004 | Tai | F21L 4/00 362/387 |
| 2004/0256188 A1 | 12/2004 | Harcourt | |
| 2006/0006038 A1 * | 1/2006 | Beverlin | B65H 75/406 191/12.2 R |
| 2006/0243845 A1 * | 11/2006 | Wegner | B65H 75/4434 242/378.1 |
| 2008/0035778 A1 * | 2/2008 | Belden | A45F 5/004 242/375 |
| 2012/0196471 A1 * | 8/2012 | Guo | H01R 13/6276 439/345 |

\* cited by examiner

RETRACTABLE CABLE ASSEMBLY IN USE WITH ELECTRICAL DEVICES

CROSS-REFERENCE TO RELATED APPLICATIONS

This application claims the benefit of provisional patent application No. 62/473,024, filed Mar. 17, 2017, by the present inventors.

FIELD OF THE INVENTION

The present invention relates to retractable cable assemblies that may be used in conjunction with electronic devices, such as electrical chargers, power supplies, and other devices needing to be connected to a power outlet.

BACKGROUND OF INVENTION

Electrical chargers and other power supplies are commonly used for charging batteries and providing power to various electronic devices. In cases where the electrical charger, power adapter, or other power supply is not in use or only a portion of the cable is required, retractable cable assemblies may be used to retract and wind the unused cable around a spool contained within an enclosed compartment. Electrical chargers and other devices with cords with retractable cable assemblies have been presented in the prior art; however, those devices are not ergonomic and include disadvantages that have not been overcome.

For example, manual retraction mechanisms have been used wherein a user may manually wind the cable using a handle attached to a spool in order to retract the cable, such as those shown in U.S. Pat. No. 6,540,168 and U.S. Patent App. 2004/0256188. This method is undesirable as it could be cumbersome for the user to manually retract the cable, particularly if the cable is long. Apart from manual retraction of the cable, several proposed retractable cable assemblies rely on the use of a torsional spring to automatically retract the cable. In these cases, the torsional spring is rotatably coupled to the spool. As the cable is pulled and unwound from the spool, the spool and the coupled torsional spring rotate. As the torsional spring rotates it compresses such that elastic energy is stored within the spring. A lock-release system is used to hold the coupled spring and spool in place when the cord is extracted and in use. When the rotatably coupled spring and spool are released for retraction, the elastic energy stored in the spring acts to decompress the spring, causing it to rotate back to its original uncompressed state while at the same time rotating the coupled spool which then retracts the cable.

Different lock-release systems have been used with the torsional spring system. For example, a release method wherein pulling the cable a small distance outward triggers the release of the locking mechanism allowing the cable to retract, such as those shown in U.S. Pat. Nos. 7,364,109 and 3,705,962. This mechanism is disadvantageous as accidental triggering of the release mechanism can easily occur, resulting in unwanted retraction. In other cases, cord clamping, such as that shown in U.S. Pat. Nos. 6,230,860 and 6,616,080 or pawl-ratchet mechanisms as in U.S. Pat. Nos. 7,017,846, 6,578,683 and 6,803,525 have been used. For pawl-ratchet mechanisms, the extracted cord is held in place when the pawl is engaged with the ratchet. When the pawl is disengaged from the ratchet, the spool and the rotatably coupled compressed spring are released. The spool then rotates and retracts the cord as the released spring decompresses back to its original uncompressed state. A small button or latch coupled to a tension spring must often be depressed or pulled such that the tension spring is stretched enough to disengage the pawl. In cases where the spring is stiff, depressing or pulling of the tension spring is difficult and uncomfortable as significant force must be applied, often with a single finger, during retraction of the cord. With all of the described retractable cable mechanisms, continuous and excess pressure on the button or latch of a pawl-ratchet assembly or pulling of the cord to trigger release of the locking mechanism may also cause malfunctioning of the retractable cable mechanism over time.

The present invention includes a retractable cable assembly using a pawl-ratchet lock-release mechanism that overcomes the disadvantages of prior retractable cable assemblies. Other types of lock-release mechanisms such as a button or latch coupled to a locking member preventing the rotation of the spool or a switch wired to an electric motor controlling the rotation of the spool may be used in the cable assembly. Unlike retractable cable assemblies known in the art, the pawl is disengaged from the ratchet or any latch-, button- or switch-activated locking mechanism is released by rotation or twisting of the housing lid or the main housing body itself as opposed to depression or pulling of a button or latch or pulling of the electric cord. In this way, the user may comfortably apply the required rotational force to the cable assembly in order to keep the pawl disengaged during cable retraction and is not required to apply unnecessary force on the cable itself, providing for greater longevity and more frequent use of the retractable cable assembly. The novel invention described herein also provides an ergonomic design that allows for retraction of cables with greater ease and comfort over retractable cable assemblies known in the art. The invention described herein is versatile and may be adapted for use with any type of electronic device that requires a power supply.

SUMMARY

The following presents a simplified summary of some embodiments of the invention in order to provide a basic understanding of the present invention. This summary is not an extensive overview of the invention. It is not intended to identify key or critical elements of the invention or to delineate the scope of the invention. Its sole purpose is to present some embodiments of the invention in a simplified form as a prelude to the more detailed description that is presented below.

The present invention is directed to a retractable cable assembly that may be used in conjunction with an electrical charger, power adapter, or other power supply. In one embodiment, a power cable may be extracted from the housing, such as an electrical charger housing, by manually pulling on the cable until the desired length of the cable is drawn. As the cable is drawn outwards and unwound from the spool located within the housing, a torsional spring located within the core of the spool and rotatably coupled to the spool is increasingly compressed. A pawl-ratchet mechanism, wherein the pawl is engaged with a ratchet fixed to the spool, is used to keep the spool and cable in place until such time when retraction of the cable is desired. In one embodiment, rotation of the housing lid of the retractable cable assembly disengages the pawl from the ratchet, thereby freeing the spool and torsional spring to allow for retraction. Immediately after disengagement, the compressed spring housed within the core of the spool rotates as it decompresses and returns back to its uncompressed state, causing the coupled spool to rotate simultaneously and the cable to retract. In other embodiments, twisting of the housing lid or twisting of the main housing body of the retractable cable assembly disengages the pawl from the ratchet, causing retraction of the cable. Rotation or twisting of the housing lid or the main housing body may be of the entire housing lid or the entire housing body, a section of the lid or housing body, an upper or lower portion, or other sections of the lid or housing body that disengage the pawl from the ratchet. Rotation and twisting of the lid or the main housing may be of various degrees and angles. In other embodiments, rotation or twisting of the housing lid or the main housing body may also release any latch-, button- or switch-activated locking mechanisms.

These and other features and advantages of the present invention will be apparent to those skilled in the art in view of the described embodiments with reference to the drawings, as provided below.

BRIEF DESCRIPTION OF THE DRAWINGS

Non-limiting and non-exhaustive features of the present invention are described with reference to the following figures, wherein like reference numerals refer to like parts throughout the various figures.

DETAILED DESCRIPTION OF THE INVENTION

The present invention will now be described in detail with reference to a few embodiments thereof, as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The present invention proposes a retractable cable assembly that may be used in conjunction with an electrical charger, power adapter, or other power supply. In one embodiment, the retractable cable assembly is comprised of a main housing body with a housing lid, a rotatable spool around which a cable is wound, a ratchet gear rotatably coupled to the rotatable spool, a pawl assembly for limiting the rotation of the ratchet gear and spool, and a torsion spring that compresses as the cable is extracted out of the main housing. Other types of assemblies may be used. For example, a button or latch coupled to a locking member preventing the rotation of the spool or a switch wired to an electric motor controlling the rotation of the spool may be used in the cable assembly.

Figure 1:
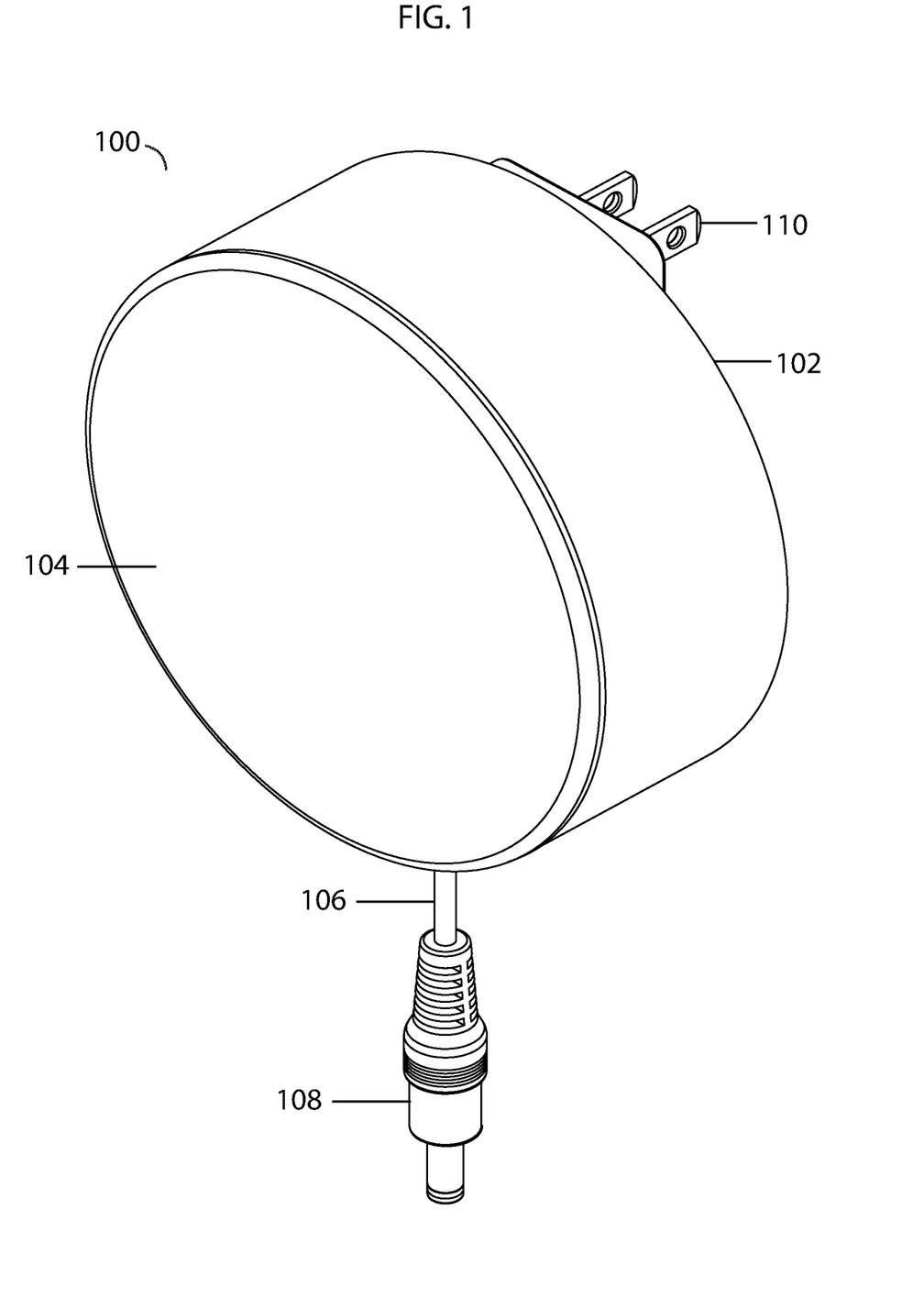
FIG. 1 illustrates a perspective view of one embodiment of the retractable cable assembly embodying features of the present invention.

FIG. 1 illustrates an embodiment of the retractable cable assembly used in conjunction with an electrical charger 100. Electrical charger 100 comprises main housing 102, housing lid 104, charging cable 106 with terminal adapter 108, and electrical wall plug 110. Adapter 108 may be connected to a receiving end of any suitable electric cable. In one embodiment, the cable does not include an adapter and is directly connected to an electric device. Housing lid 104 is attachable to main housing 102 and capable of manual clockwise or counterclockwise rotation. Within main housing 102, the rest of charging cable 106 is wound around the rotatable spool (not shown). Charging cable 106 exits the main housing through an aperture therein (not shown) from which it may be manually pulled outwards for use. In another embodiment, the cable is automatically release through depression or pressing of a button or latch or other release switch.

Figure 2:
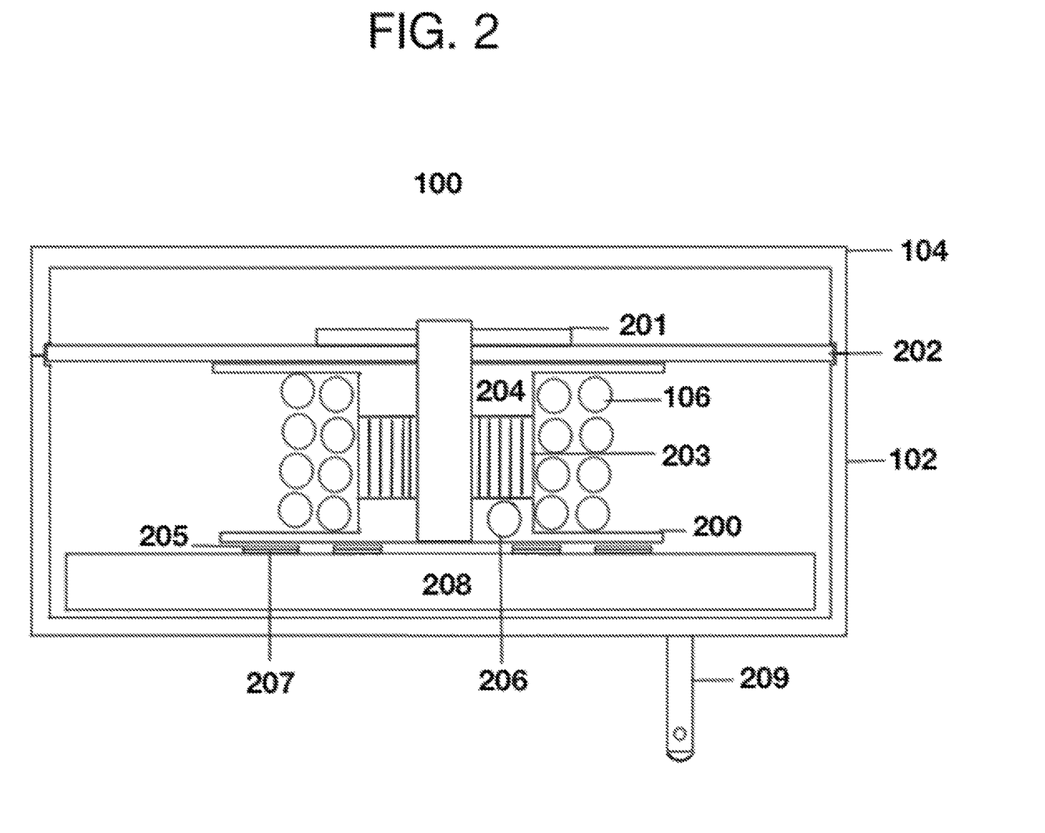
FIG. 2 illustrates a cross sectional side view of one embodiment of the retractable cable assembly embodying features of the present invention.

FIG. 2 illustrates a cross sectional side view of an embodiment of the retractable cable assembly used in conjunction with electrical charger 100. Internal components of electrical charger 100 are housed within main housing 102 with housing lid 104. Rotatable spool 200 with rotatably coupled ratchet gear 201 is concentrically centered within main housing 102. Separating plate 202 is seated between ratchet gear 201 and spool 200 and is fixed to main housing 102. Torsional spring 203 is located within core 204 of spool 200 while cable 106 is wound around core 204. Two circular contacts 205 are installed on the underside of spool 200, one negative and one positive, such that terminal end 206 of cable 106 can be connected to contacts 205. Another two circular contacts 207 are installed on top of electrical hardware compartment 208, one positive and one negative, such that electrical wall plug 209 can be connected to contacts 207. Contacts 205 and 207 are positioned adjacent to one another within housing 102 such that continuous contact is made when cable 106 is extracted from housing 102 and spool 200 is rotated. The pawl, attached to the top surface of separation plate 202, is not depicted.

Figure 3A:
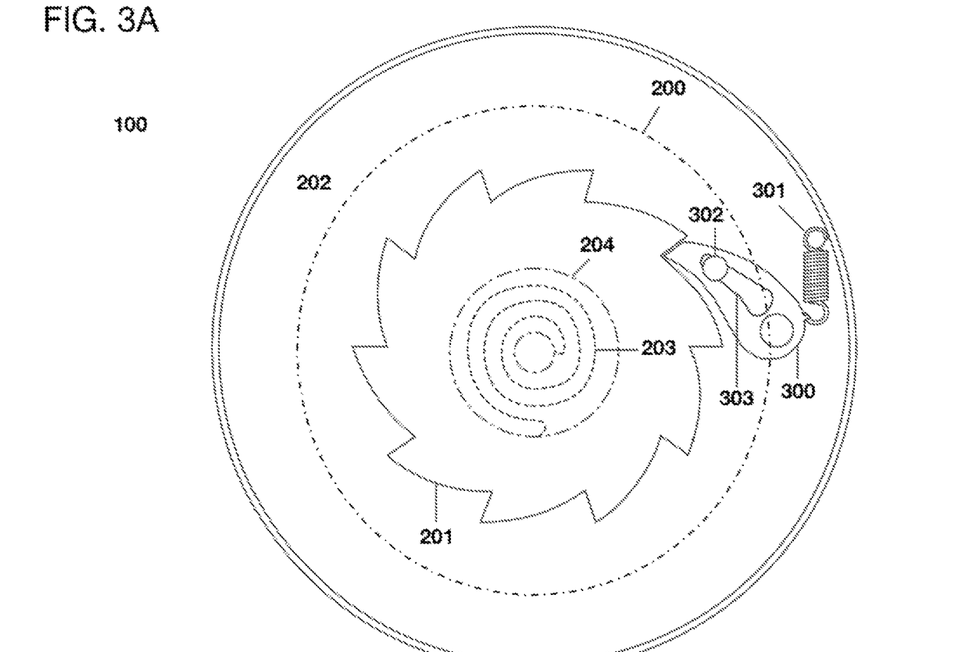
FIG. 3A illustrates a cross sectional top view of one embodiment of the retractable cable assembly with the pawl of the retractable cable assembly engaged, embodying features of the present invention.

FIG. 3A illustrates a cross sectional top view of one embodiment of the retractable cable assembly used in conjunction with electrical charger 100 with pawl 300 engaged. Torsional spring 203, located within core 204 of spool 200, compresses as spool 200 rotates counter clockwise. Ratchet gear 201 is rotatably coupled to spool 200 such that it rotates with spool 200. Pawl 300 is fixed to separating plate 202 and is held against ratchet gear 201 by tension spring 301. It prevents ratchet gear 201 and attached spool 200 from rotating clockwise until a force is applied to disengage pawl 300.

Figure 3B:
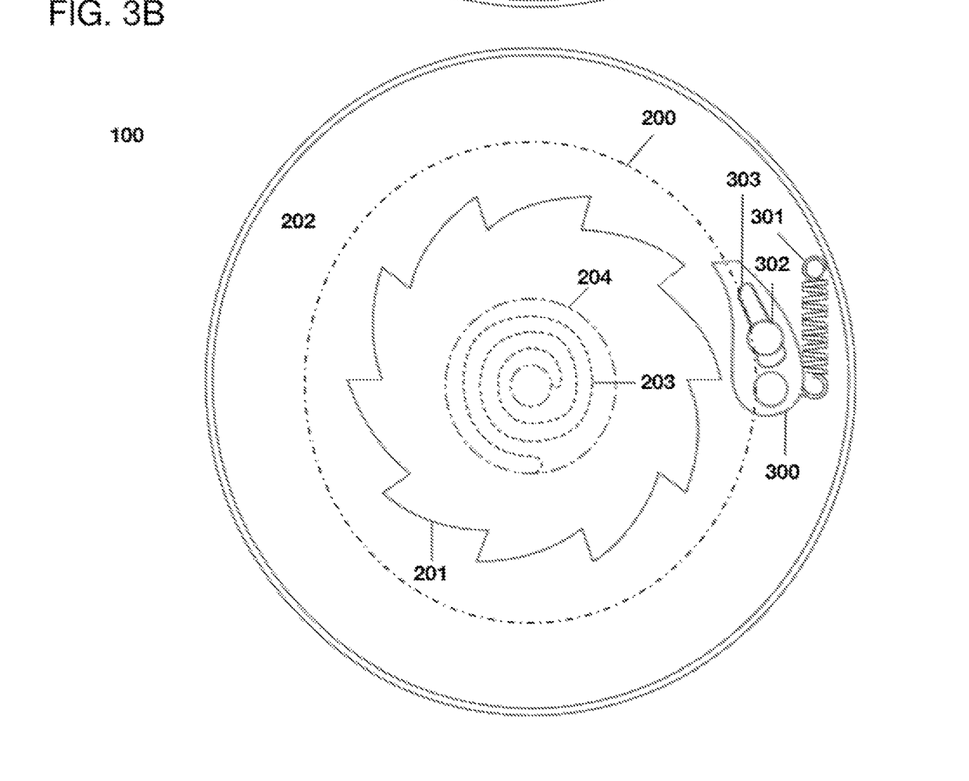
FIG. 3B illustrates a cross sectional top view of one embodiment of the retractable cable assembly with the pawl of a retractable cable assembly disengaged, embodying features of the present invention.

FIG. 3B illustrates a cross sectional top view of an embodiment of the retractable cable assembly used in conjunction with electrical charger 100 with pawl 300 disengaged. Pin 302, fixed to the underside of the housing lid (not shown), is used to disengage pawl 300 when the housing lid is rotated clockwise. In another embodiment, the housing lid may be rotated counterclockwise. As the housing lid is rotated clockwise, tension spring 301 is stretched and pin 302 slides along slot 303 in pawl 300, causing pawl 300 to be pulled away and to disengage from ratchet gear 201. Rotation of the housing lid may be of any suitable degree. In another embodiment, the pawl may be disengaged by rotation of the main housing body or a portion thereof. In another embodiment, the housing lid may encompass the side of the main housing body such that rotation of the housing lid comprises rotation of the side and/or top portion of the main housing body. In another embodiment, rotation and subsequent disengagement of the pawl may comprise rotation of the side of the main housing body. Immediately after pawl 300 is disengaged from ratchet gear 201, torsion spring 203, and thereby spool 200, rotate clockwise as torsion spring 203 decompresses and returns back to its uncompressed state. This causes the charging cable to be drawn in and wound around spool 200. When the housing lid is released, tension spring 301 forces pawl 300 back to its resting position where it is engaged with ratchet gear 201 once again.

Figure 4:
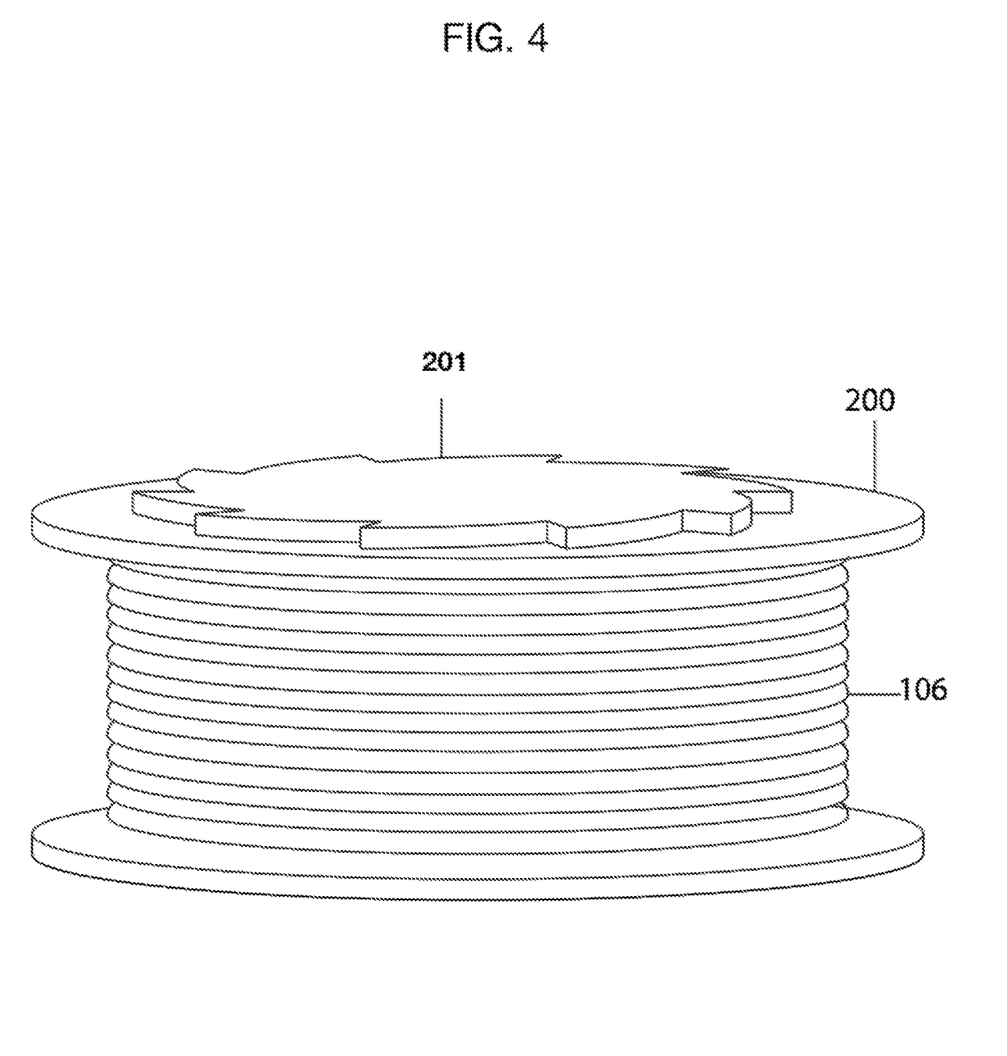
FIG. 4 illustrates a perspective view of a spool with fixed ratchet gear and wound cable of one embodiment of the retractable cable assembly, embodying features of the present invention.

FIG. 4 illustrates an embodiment of the retractable cable assembly used in conjunction with a perspective view of spool 200 with fixed ratchet gear 201 and wound cable 106 of an electrical charger. Ratchet gear 201 is fixed to one side of spool 200 to limit the movement of spool 200 and torsion spring 204 (not shown) housed within the core of spool 200.

Figure 5A:
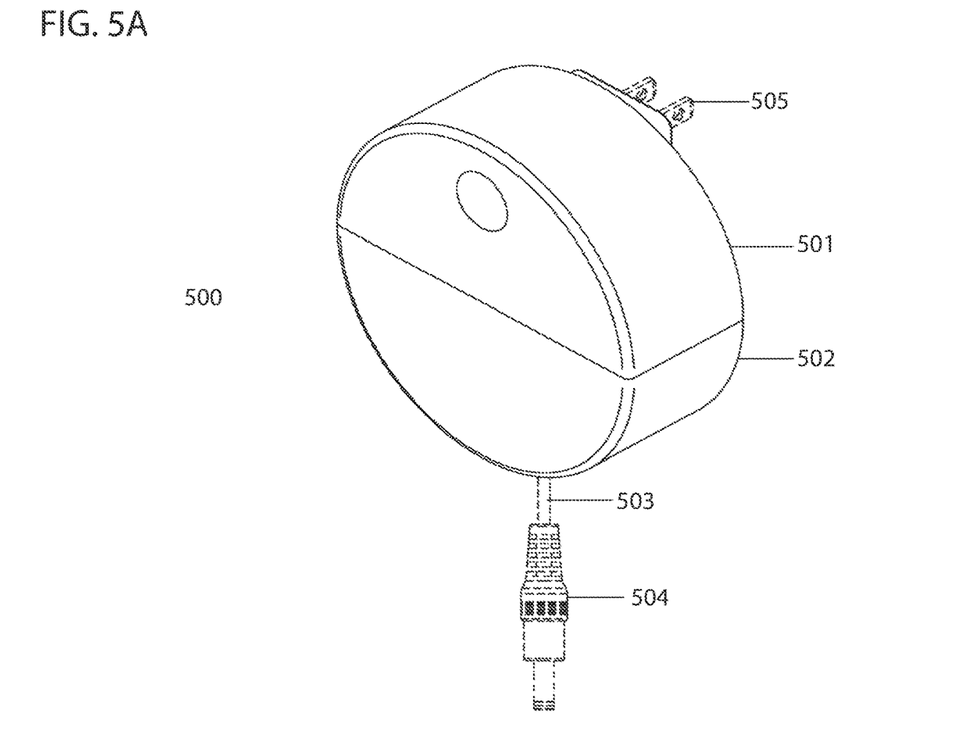
FIG. 5A illustrates a perspective view of one embodiment of the retractable cable assembly embodying features of the present invention.

FIG. 5A illustrates one embodiment of the retractable cable assembly used in conjunction with electrical charger 500 comprising a main housing consisting of upper housing 501 and bottom housing 502, charging cable 503 with terminal adapter 504, and electrical wall plug 505. Adapter 504 may be connected to a receiving end of any suitable electric cable. In one embodiment, the cable does not include an adapter and is directly connected to an electric device. Upper housing 501 is static while bottom housing 502 is capable of clockwise or counterclockwise rotation about a vertical axis with respect to upper housing 501. In another embodiment, the lower housing 502 is static while the upper housing 501 is capable of clockwise or counterclockwise rotation about a vertical axis with respect to lower housing 502. Within bottom housing 502, the rest of charging cable 503 is wound around the rotatable spool (not shown). Charging cable 503 exits the main housing through an aperture therein (not shown) from which it may be manually pulled outwards for use. In another embodiment, the cable is automatically released through depression or pressing of a button or latch or other release switch.

Figure 5B:
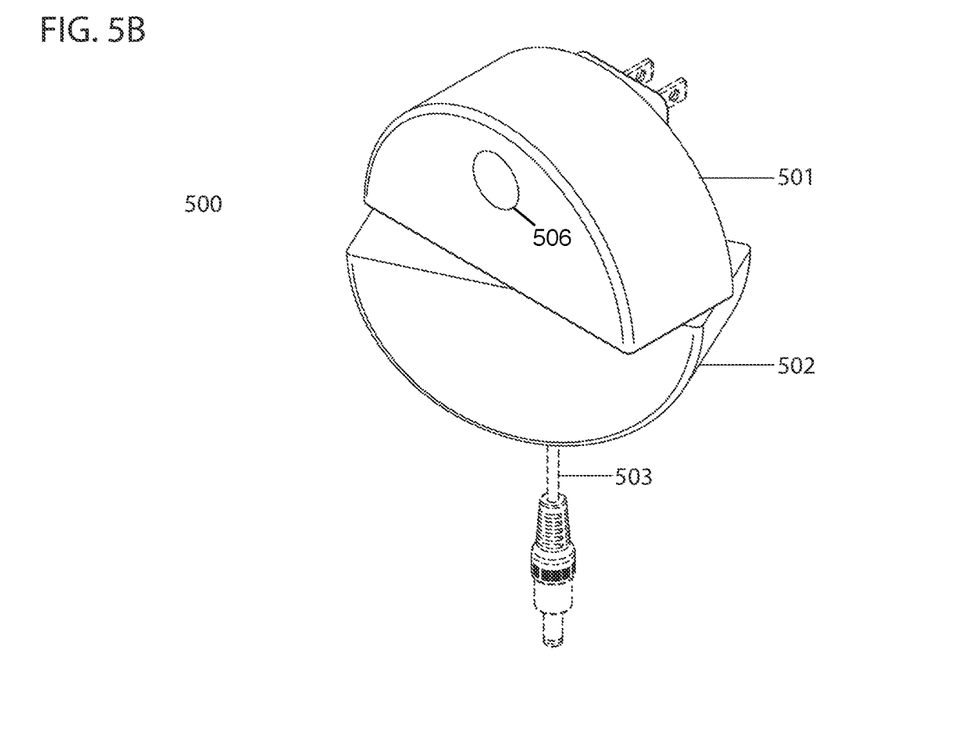
FIG. 5B illustrates a perspective view of one embodiment of the retractable cable assembly whereby a cable is retracted, embodying features of the present invention.

FIG. 5B illustrates one embodiment of the cable assembly where bottom housing 502 is rotated counterclockwise about a vertical axis with respect to upper housing 501 to activate retraction of charging cable 503. Rotation or twisting of bottom housing 502 disengages a pawl-ratchet mechanism (not shown) or releases any latch-, button- or switch-activated locking mechanisms and causes retraction of cable 503. Locking mechanisms may comprise any assembly or apparatus used in preventing retraction of the cable. The main housing may include indicator light 506, which indicates the charging status of the electrical charger 500.

Rotating or twisting of the main housing may comprise rotation of the main housing about the vertical axis whereby rotation of the main housing may be of any suitable degree, depressing to one side or the other of either the upper or lower portion of the main housing, or other suitable turning motion that disengages the pawl-ratchet mechanism or any releases latch-, button- or switch-activated locking mechanisms and causes retraction of the cable. Locking mechanisms may comprise any assembly or apparatus used in preventing retraction of the cable. Although the above figures illustrate embodiments of the retractable cable assembly in conjunction with an electrical charger, other power adapters or power supplies may be used.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

We claim:

1. A retractable cable assembly comprising:
   a housing capable of rotation with an aperture through which a cable exits;
   a spool within the housing for retaining a cable;
   a cable capable of being wound around the spool;
   a torsional spring within a core of the spool;
   a ratchet gear and pawl, wherein the pawl is engageably coupled to the ratchet gear and the ratchet gear is fixed to the spool; and
   a separation plate seated between the ratchet gear and the spool, wherein the pawl is fixed to the separation plate;
   wherein rotation of the housing causes the pawl to disengage from the ratchet gear and the cable to retract and wind around the spool.

2. The retractable cable assembly of claim 1, wherein rotation of the housing comprises rotation of a housing lid.

3. The retractable cable assembly of claim 1, wherein rotation of the housing comprises rotation of a side of the housing.

4. The retractable cable assembly of claim 1, wherein rotation of the housing comprises rotation of a lower housing about a vertical axis with respect to an upper housing.

5. The retractable cable assembly of claim 1, wherein rotation of the housing comprises rotation of an upper housing about a vertical axis with respect to a lower housing.

6. The retractable cable assembly of claim 1, wherein the torsional spring tightens and compresses as the spool rotates in a first direction.

7. The retractable cable assembly of claim 6, further comprising a tension spring connected to the separation plate on one end and the pawl on the other end, wherein the tension spring causes the pawl to engage with the ratchet gear thereby preventing ratchet gear, spool and torsional spring from rotating in a second direction opposite the first direction; and wherein the tension spring causes the pawl back into an engaged position with the ratchet gear when the housing is returned to an unrotated position.

8. The retractable cable assembly of claim 7, further comprising a pin coupled to the underside of the housing, wherein the pin slides along a pawl slot as the housing is rotated in a second direction opposite the first, causing the tension spring connected to the pawl to stretch and pull the pawl away until it disengages from the ratchet gear and wherein decompression of the torsional spring causes the spool to rotate in a second direction opposite the first and retract and wind the cable around the spool.

9. The retractable cable assembly of claim 1, wherein the cable assembly comprises an electrical charger.

10. The retractable cable assembly of claim 1, further comprising a release switch for automatic unwinding of the cable.

11. The retractable cable assembly of claim 1, further comprising an electric plug coupled to the housing.

12. The retractable cable assembly of claim 1 further comprising a first pair of circular contacts installed on the underside of the spool, one being negative and the other positive, and connected to a terminal end of the cable.

13. The retractable cable assembly of claim 12, wherein second pair of circular contacts are installed on the top of the electrical hardware compartment, one being negative and the other positive, and connected to an electrical wall plug.

14. The retractable cable assembly of claim 1, wherein the cable comprises an adapter connected to a receiving end of an electric cable.

15. An electric charger with a retractable cable assembly comprising:
   a housing capable of rotation with an aperture through which an electric cable exits;
   a spool within the housing for retaining the electric cable such that the electric cable may be wound around the spool; and
   locking means for preventing retraction of the electric cable;
   wherein the housing comprises a rotational portion for activating retraction of the electric cable by disengaging the locking means.

16. The electric charger of claim 15, wherein the rotation portion of the housing comprises a housing lid.

17. The retractable cable assembly of claim 15, wherein the rotation portion of the housing comprises a lower housing capable of rotation about a vertical axis with respect to an upper housing.

18. The retractable cable assembly of claim 15, wherein the rotation portion of the housing comprises an upper housing capable of rotation about a vertical axis with respect to a lower housing.

19. A method for retracting a cable assembly; comprising:
   engaging a locking means for prevention of retraction of the cable assembly; and
   rotating a portion of a housing of the cable assembly;
   wherein rotation of the housing disengages the locking means and retracts the cable.

20. The method of claim 19 wherein rotating a portion of the housing means comprises rotating of a housing lid.

* * * * *